(12) United States Patent
Flynn et al.

(10) Patent No.: US 11,683,034 B2
(45) Date of Patent: *Jun. 20, 2023

(54) HIGH SPEED SWITCHING SOLID STATE RELAY CIRCUIT

(71) Applicant: QM Power, Inc., Kansas City, MO (US)

(72) Inventors: Charles J. Flynn, Greenwood, MO (US); Cooper Tracy, Belton, MO (US); W. Scott Hunter, Greenwood, MO (US)

(73) Assignee: QM POWER, INC., Kansas City, MO (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/836,746

(22) Filed: Jun. 9, 2022

(65) Prior Publication Data
US 2022/0302916 A1    Sep. 22, 2022

Related U.S. Application Data

(63) Continuation of application No. 17/171,787, filed on Feb. 9, 2021, now Pat. No. 11,387,827, which is a
(Continued)

(51) Int. Cl.
*H02M 1/32* (2007.01)
*H03K 17/785* (2006.01)
(Continued)

(52) U.S. Cl.
CPC ............... *H03K 17/785* (2013.01); *H02J 4/00* (2013.01); *H02M 1/32* (2013.01); *H02M 7/2176* (2013.01);
(Continued)

(58) Field of Classification Search
CPC ...... H02M 1/32; H02M 3/145; H02M 3/1564; H02M 3/158; H02M 5/2937; H02M 7/2176; H02K 17/785; H02J 4/00; H03K 17/6871

See application file for complete search history.

(56) References Cited

U.S. PATENT DOCUMENTS 3,697,772 A    10/1972  Gibbs
4,041,331 A    8/1977   Westerman et al.
(Continued)

FOREIGN PATENT DOCUMENTS

CN    101465638 B    8/2011

*Primary Examiner* — Adolf D Berhane
(74) *Attorney, Agent, or Firm* — Finnegan, Henderson, Farabow, Garret & Dunner LLP

(57) ABSTRACT

A system and method for high speed switching comprises receiving voltage inputs at a bridge rectifier, generating a control signal from a transistor, and driving a gate of a field effect transistor (FET) via the control signal of the transistor, wherein a source of the FET is connected to a negative output of the bridge rectifier and a drain of the FET is connected to a positive output of the bridge rectifier through a load. The system and method further comprises limiting current flowing to the gate of the FET through first and second resistors and first and second diodes connecting the voltage inputs to the gate of the FET and limiting voltage to the gate of the FET below a maximum voltage rating of the FET by a Zener diode connected to the gate of the FET.

20 Claims, 3 Drawing Sheets

Related U.S. Application Data continuation of application No. 16/551,516, filed on Aug. 26, 2019, now Pat. No. 10,924,110, which is a continuation of application No. 16/025,984, filed on Jul. 2, 2018, now Pat. No. 10,396,781, which is a continuation of application No. 15/228,780, filed on Aug. 4, 2016, now Pat. No. 10,014,858, which is a continuation of application No. 14/706,010, filed on May 7, 2015, now Pat. No. 9,438,101.

(51) Int. Cl.
  *H02M 7/217*    (2006.01)
  *H02J 4/00*    (2006.01)
  *H03K 17/687*    (2006.01)
  *H02M 5/293*    (2006.01)

(52) U.S. Cl.
  CPC ....... *H03K 17/6871* (2013.01); *H02M 5/2937* (2021.05)

(56) References Cited

U.S. PATENT DOCUMENTS

| | | |
|---|---|---|
| 4,193,111 A | 3/1980 | Wester |
| 4,933,612 A | 6/1990 | Bonin |
| 5,077,486 A | 12/1991 | Marson et al. |
| 5,124,905 A | 6/1992 | Kniepkamp |
| 5,610,793 A | 3/1997 | Luu |
| 5,892,354 A | 4/1999 | Nagao et al. |
| 6,046,916 A | 4/2000 | Wuidart et al. |
| 6,370,045 B1 | 4/2002 | Lürkens |
| 6,563,720 B2 | 5/2003 | Kitano |
| 6,590,793 B1 | 7/2003 | Nagaeo et al. |
| 7,071,668 B2 | 7/2006 | Sasaki |
| 8,378,647 B2 | 2/2013 | Yonezawa et al. |
| 8,659,924 B2 | 2/2014 | Yamada et al. |
| 8,884,594 B2 | 11/2014 | Sugiura |
| 9,300,237 B2 | 3/2016 | Flynn et al. |
| 9,438,101 B1 | 9/2016 | Flynn et al. |
| 9,705,441 B2 | 7/2017 | Flynn et al. |
| 9,893,667 B2 | 2/2018 | Flynn et al. |
| 10,014,858 B2 | 7/2018 | Flynn et al. |
| 10,396,781 B2 * | 8/2019 | Flynn ...................... H02M 1/32 |
| 10,461,671 B2 | 10/2019 | Yabuguchi et al. |
| 10,924,110 B2 * | 2/2021 | Flynn ................... H03K 17/785 |
| 11,387,827 B2 * | 7/2022 | Flynn ................... H02M 7/2176 |
| 2001/0045863 A1 | 11/2001 | Pelly |
| 2010/0320837 A1 | 12/2010 | Harrison |
| 2011/0291605 A1 | 12/2011 | Sakaguchi et al. |
| 2012/0193988 A1 | 8/2012 | Eschrich et al. |
| 2014/0152228 A1 | 6/2014 | Flynn et al. |

* cited by examiner

HIGH SPEED SWITCHING SOLID STATE RELAY CIRCUIT

This application is a continuation of U.S. Nonprovisional patent application Ser. No. 17/171,787 filed on Feb. 9, 2021, which is a continuation of U.S. Nonprovisional patent application Ser. No. 16/551,516 filed Aug. 26, 2019, now U.S. Pat. No. 10,924,110, which is a continuation of U.S. Nonprovisional patent application Ser. No. 16/025,984 filed on Jul. 2, 2018, now U.S. Pat. No. 10,396,781, which is a continuation of U.S. Nonprovisional patent application Ser. No. 15/228,780 filed on Aug. 4, 2016, now U.S. Pat. No. 10,014,858, which is a continuation of U.S. Nonprovisional patent application Ser. No. 14/706,010 filed on May 7, 2015, now U.S. Pat. No. 9,438,101, the entire contents of which are incorporated herein by reference.

FIELD

The disclosure relates generally to switching circuits and in particular to high speed switching solid state relay circuits.

DESCRIPTION OF THE RELATED ART

Advances in solid-state switching and relay technology have made possible the replacement of many electro-mechanical switching and relay assemblies. Solid-state devices provide the power control systems in which they are incorporated with long life, quiet operation and other associated advantages.

The solid state relay is a non-contact electronic switch-off for the four-terminal active device, with two input and two output terminals. With a DC pulse signal coupled to the input terminals, the output can be in an off state or conductive state, that is, when a voltage is applied between the input terminals, the solid state relay is turned on, and when voltage between the input terminals is withdrawn the solid state relay is turned off. Since the solid state relays do not have contact switch elements, compared with the electro-mechanical relays, they have advantages such as better reliability, longer life, freedom from outside interference, anti jamming capability, compatibility with logic circuits, high speed switching etc.

However, existing solid state relays have some disadvantages. They require several types of protection, including high voltage and high current protection. Solid-state relays cannot be maintained and have to be replaced if damaged. The solid state relays also exhibit non-linear voltage-current characteristics.

CN2912059Y discloses a current limiting protection type solid state relay. The main drawback is that this design uses a large number of components for the current limiting circuit with high cost. CN I01465638B discloses a low-power solid state relay, comprising a switch circuit, a first and a second charging circuit, and a discharging circuit. The main drawback of this design is that the switching speed is slower than other devices.

The invention addresses some of the drawbacks of conventional solid state relays, with further related advantages as set forth here.

SUMMARY

An electronic circuit for high speed switching from a power source to a load is disclosed. The circuit includes a switching section, a current limiting section and a voltage limiting section. The switching section comprises a bridge rectifier receiving the load voltage inputs, a MOSFET with a source, drain and gate; the source connected to a negative voltage of the load through the bridge rectifier, the drain connected to the load voltage output. The switching section further includes an isolator circuit comprising an optically-coupled LED. The isolator circuit is configured to receive a logic input signal and generate an isolated output signal based on the logic input signal, and the gate of the MOSFET is driven by the isolated output signal. The current limiting section includes a first set of resistors connecting the voltage drop across the load to the gate of the MOSFET through diodes, wherein the first set of resistors and the diodes are configured to limit current flowing to the gate of the MOSFET. The voltage limiting section comprises a Zener diode connected to the gate of the MOSFET and configured to clamp the voltage to the gate below the maximum voltage rating of the MOSFET.

In some embodiments the current limiting section further comprises a control circuit with a control transistor and a second set of resistors. The control transistor electrically connects the gate of the MOSFET to the source of the MOSFET when the control transistor is ON, thereby turning OFF the MOSFET. The control transistor is turned OFF when the isolator circuit output signal is turned ON.

In one embodiment the control circuit further comprises a first capacitor configured to filter noise from the diodes and a second capacitor configured to maintain the gate of the MOSFET at a positive voltage.

In one embodiment the bridge rectifier is configured to maintain the MOSFET source at a negative voltage and the MOSFET drain at a positive voltage.

In one embodiment the diodes are identical and are configured to allow only positive voltage to the gate of MOSFET with reference to the MOSFET source.

In one embodiment the second set of resistors are low value resistors. In one embodiment one low value resistor is configured to reduce the gate capacitance of the MOSFET and the other low value resistor is configured to limit the current to the Zener diode.

In one embodiment the first set of resistors are high value resistors. In one embodiment a high value pull-up resistor is connected between the diodes and the base of the control transistor.

In various embodiments of the circuit the load is an AC load or a DC load.

In another aspect, a switching circuit includes a bridge rectifier to receive voltage inputs and an optical isolator to receive a logic input signal and generate an output signal based on the logic input signal. The switching circuit also includes a field effect transistor (FET) with a source connected to a negative output of the bridge rectifier, a drain connected to a positive output of the bridge rectifier through a load, and a gate driven by the output signal of the optical isolator. First and second resistors connect the voltage inputs to the gate of the FET through first and second diodes. The first and second resistors and the first and second diodes limit current flowing to the gate of the FET. A Zener diode connected to the gate of the FET limits voltage to the gate of the FET below a maximum voltage rating of the FET.

In another aspect, a method for a switching circuit includes providing a bridge rectifier to receive voltage inputs and providing an optical isolator to receive a logic input signal and generate an output signal based on the logic input signal. A field effect transistor (FET) is provided with a source connected to a negative output of the bridge rectifier, a drain connected to a positive output of the bridge rectifier through a load, and a gate driven by the output signal of the optical isolator. First and second resistors connect the voltage inputs to the gate of the FET through first and second diodes. The first and second resistors and the first and second diodes limit current flowing to the gate of the FET. A Zener diode connected to the gate of the FET limits voltage to the gate of the FET below a maximum voltage rating of the FET.

In another aspect, a method for high speed switching comprises receiving voltage inputs at a bridge rectifier, receiving a logic input signal at an optical isolator and generating an output signal from the optical isolator based on the logic input signal, and driving a gate of a field effect transistor (FET) via the output signal of the optical isolator, wherein a source of the FET is connected to a negative output of the bridge rectifier and a drain of the FET is connected to a positive output of the bridge rectifier through a load. The method further includes limiting current flowing to the gate of the FET through first and second resistors and first and second diodes connecting the voltage inputs to the gate of the FET and limiting voltage to the gate of the FET below a maximum voltage rating of the FET by a Zener diode connected to the gate of the FET.

In another aspect, a high speed switching circuit comprises a bridge rectifier to receive voltage inputs and a field effect transistor (FET) with a source connected to a negative output of the bridge rectifier, a drain connected to a positive output of the bridge rectifier through a load, and a gate driven by a control signal. The high speed switching circuit also includes a control transistor to control the FET with the control signal, first and second resistors connecting the voltage inputs to the gate of the FET through first and second diodes, wherein the first and second resistors and the first and second diodes limit current flowing to the gate of the FET, and a Zener diode connected to the gate of the FET to limit voltage to the gate of the FET below a maximum voltage rating of the FET.

In another aspect, a high speed switching method comprises receiving voltage inputs at a bridge rectifier, generating a control signal from a transistor, and driving a gate of a field effect transistor (FET) via the control signal of the transistor, wherein a source of the FET is connected to a negative output of the bridge rectifier and a drain of the FET is connected to a positive output of the bridge rectifier through a load. The method further comprises limiting current flowing to the gate of the FET through first and second resistors and first and second diodes connecting the voltage inputs to the gate of the FET and limiting voltage to the gate of the FET below a maximum voltage rating of the FET by a Zener diode connected to the gate of the FET.

BRIEF DESCRIPTION OF THE DRAWINGS

The invention has other advantages and features which will be more readily apparent from the following detailed description of the invention and the appended claims, when taken in conjunction with the accompanying drawings, in which:

DETAILED DESCRIPTION

Figure 1A:
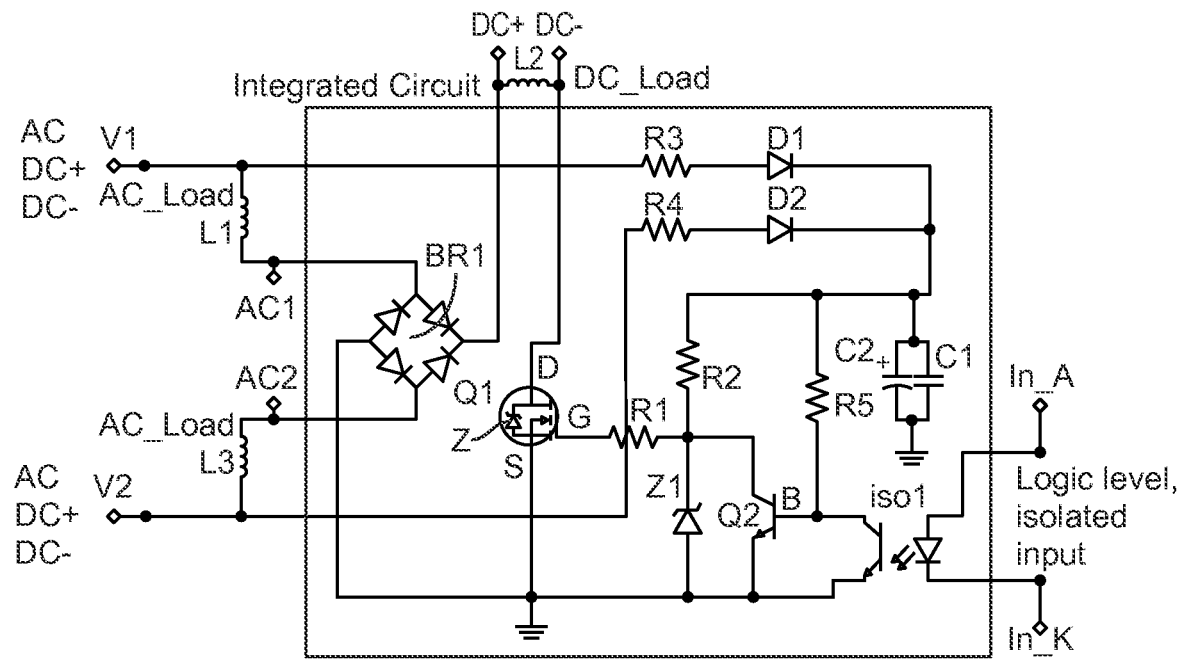
FIGS. 1A and 1B show embodiments of the high speed switching solid state relay circuit.

While the invention has been disclosed with reference to certain embodiments, it will be understood by those skilled in the art that various changes may be made and equivalents may be substituted without departing from the scope of the invention. In addition, many modifications may be made to adapt to a particular situation or material to the teachings of the invention without departing from its scope.

Throughout the specification and claims, the following terms take the meanings explicitly associated herein unless the context clearly dictates otherwise. The meaning of "a", "an", and "the" include plural references. The meaning of "in" includes "in" and "on." Referring to the drawings, like numbers indicate like parts throughout the views. Additionally, a reference to the singular includes a reference to the plural unless otherwise stated or inconsistent with the disclosure herein.

In various embodiments, a high speed switching solid state relay circuit is disclosed, that includes a switching section with a metal oxide semiconductor field effect transistor (MOSFET), connecting a power source to an AC or DC load, such as an electric motor, for example. The gate of the MOSFET is driven by a circuit receiving a logic signal. The gate drive circuit further comprises a current limiting section and a voltage limiting section to protect the MOSFET.

In one embodiment, the invention is a high speed switching solid state relay circuit as shown in FIG. 1A. The circuit consists of a switching section, a current limiting section and a voltage limiting section. The switching section includes bridge rectifier BR1 receiving load voltage inputs from a power source and MOSFET Q1 with source S connected to the voltage across the AC_Load through the bridge rectifier BR1, a drain D connected to the load voltage output. In the embodiment of the invention shown in FIG. 1A, the circuit is configured with external circuitry to switch a pair of motor coils represented by L1 and L3, connected across terminals V1 and AC1, and V2 and AC2, respectively, with DC load L2 connected across the bridge rectifier BR1 and the drain D of the MOSFET Q1. MOSFET Q1 includes a Zener diode Z1 connected between the source S and the drain D. The switching circuit further includes an isolator circuit comprising an optically-coupled LED ISO1. The positive side of the DC_Load is connected to the positive output of bridge rectifier BR1 and the negative side of the DC_Load is switched through MOSFET Q1. DC load is represented by coil L2. Zener diode Z1 acts as a flywheel diode to protect the MOSFET Q1 and to dissipate any back emf generated by the windings L1, L2 and L3 when the MOSFET Q1 is OFF. In various embodiments, either one or both the coils L1 or L3 could be used. In case only one coil is used, the other coil is shorted.

The current limiting section in the circuit includes a first set of resistors R3 and R4 connecting the voltage drop across the load to the gate G of the MOSFET Q1 through diodes D1. and D2. Resistors R3 and R4 and the diodes D1 and D2 are configured to limit current flowing to the gate G of the MOSFET Q1. The voltage limiting section comprises a Zener diode Z1 connected to the gate G of the MOSFET Q1. Zener diode Z1 is configured to clamp the voltage to the gate G to be below the maximum rated voltage of the MOSFET Q1. In one embodiment the resistors R3 and R4 are high value resistors.

In one embodiment the current limiting section further comprises a control circuit with a control transistor Q2 and a second set of resistors R1 and R2. The control transistor Q2 electrically connects the gate G of MOSFET Q1 to the source S of the MOSFET Q1. In embodiments of the circuits shown in FIG. 1A, the second sets of resistors R1 and R2 are low value resistors. Resistor R1 is a gate resistor configured to constrain the instantaneous current drawn when the MOSFET Q1 is turned ON and R2 is used to limit the current to the Zener diode Z1.

Figure 1B:
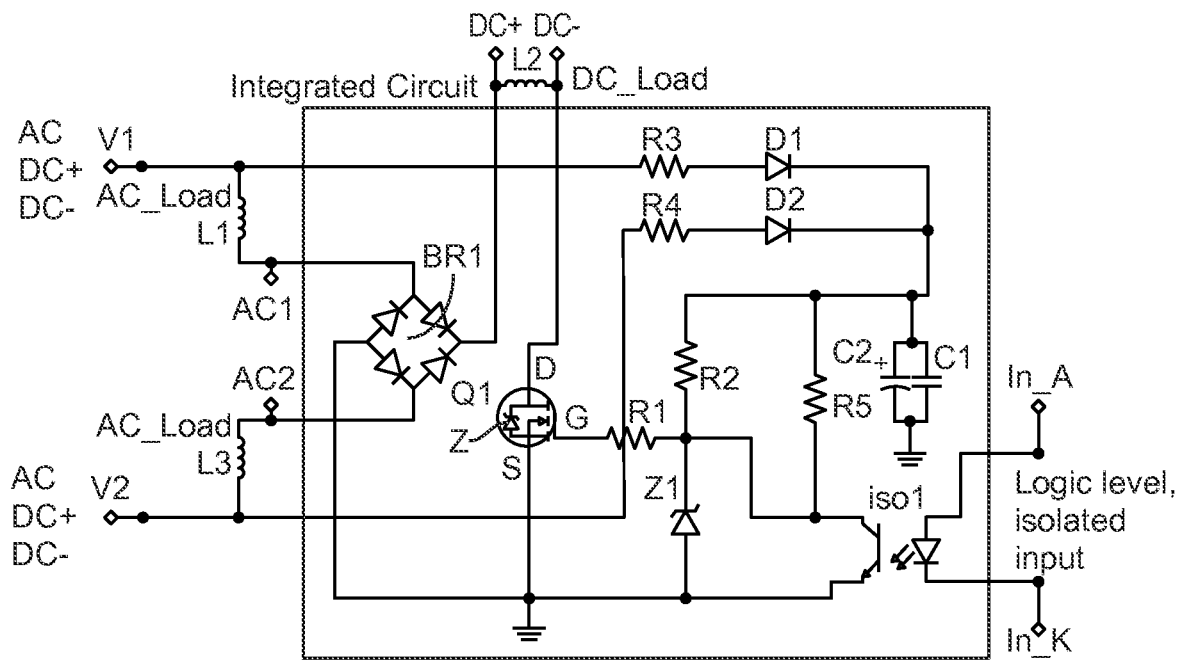

In one embodiment of the invention shown in FIG. 1B, the circuit is configured to take either a DC or AC input to run a DC load L2 connected across the bridge rectifier BR1 and the drain D of the MOSFET Q1. As shown in FIG. 1B, terminals V1 and AC1, and V2 and AC2 are shorted and connected to the AC or DC input.

In some embodiments of the circuits shown in FIGS. 1A and 1B, the control circuit further includes a first capacitor C1 configured to filter noise from the diodes D1 and D2 and a second capacitor C2 configured to maintain the gate G of the MOSFET Q1 at a positive voltage. In embodiments of the circuits shown in FIGS. 1A and 1B, a high value pull-up resistor R5 is connected between the diodes D1 and D2, and the base B of the control transistor Q2 to limit current flowing to the gate G of MOSFET Q1. In one embodiment, the diodes D1 and D2 are identical and are configured to allow only positive voltage to the gate G of the MOSFET Q1 with reference to the source S of the MOSFET Q1. In embodiments of the circuits shown in FIGS. 1A and 1B, the bridge rectifier BR1 maintains the source S of the MOSFET Q1 at a negative voltage and the drain D of MOSFET Q1 at a positive voltage.

In operation of the circuit of one embodiment as shown in FIG. 1A, Coils LI and L3 could be configured to run in alternate polarity of a motor. When MOSFET Q1 is ON, current will flow from the positive output of BR1, through the DC load L2, through Q1 from drain D to source S, then back to the negative output of BR1. The isolator circuit is configured to receive a logic input signal via isolator ISO1, the output of the ISO1 is given as input to the base B of the control transistor Q2, and the generated isolated output signal from collector C of the control transistor Q2 is given to the gate G of the MOSFET Q1 via R1. When the logic input is HIGH, MOSFET Q1 is "closed" and allows current to pass through the DC load L2. When the logic input is LOW, MOSFET Q1 is "open", thereby opening the switch.

In one embodiment gate G of the MOSFET receives inputs via the control transistor Q2, which electrically connects the gate G of MOSFET Q1 to the source S of the MOSFET when the control transistor Q2 is ON, thereby turning OFF the MOSFET Q1 and the load L2 is disconnected. In one embodiment the control transistor Q2 is turned OFF when the isolator circuit ISO1 output signal is turned ON and current passes through MOSFET Q1 and the DC load L2. The control transistor Q2 ensures a "normally open" state when there is no logic input or In_A is held low with reference to In_K.

In various embodiments, the input power to the circuit may be AC or DC power. The load connected to the circuit in various embodiments could also be an AC or a DC load. In the embodiment of the circuit shown in FIG. 1B, the polarity of the input supply is interchangeable across the terminals V1/AC1 and V2/AC2, without affecting operation of the load or damage to the circuit components.

The circuit disclosed with reference to any of the above embodiments may be used in an integrated circuit chip.

Advantages of the invention are that the switching circuit is designed using discrete components: MOSFET, diode bridge, resistors, capacitors, diodes, transistor and an isolator, creating a circuit that functions similar to a solid state relay, at a much lower cost, while providing increased switching speeds and higher power ratings.

While the invention has been disclosed with reference to certain embodiments, it will be understood by those skilled in the art that various changes may be made and equivalents may be substituted without departing from the scope of the invention. In addition, many modifications may be made to adapt to a particular situation or material the teachings of the invention without departing from its scope as further explained in the following examples, which however, are not to be construed to limit the scope of the invention as delineated by the claims.

Example 1

Figure 2A:
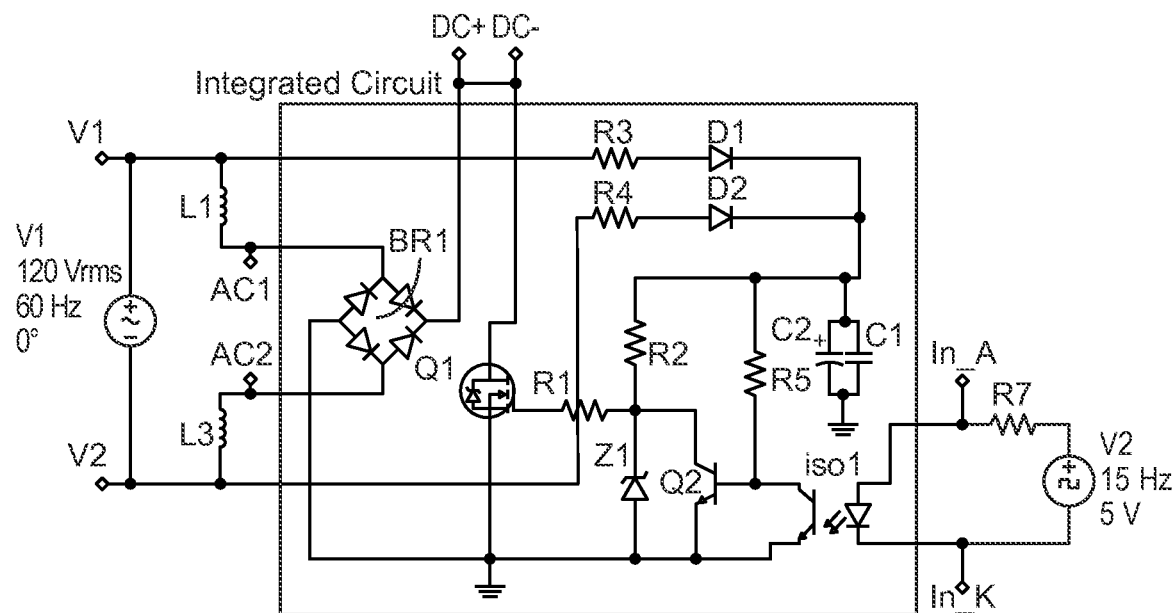
FIG. 2A shows an example where the circuit is used for an AC load configured to switch a pair of motor coils represented by L1 and L3.
Figure 2B:
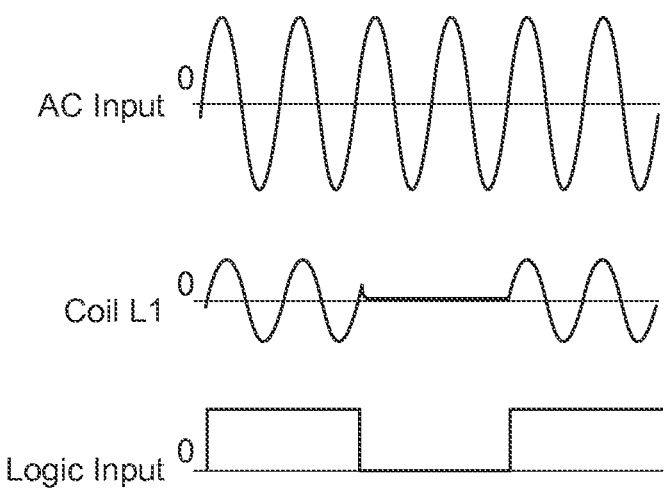
FIG. 2B shows schematic waveforms for the circuit of FIG. 2A.

An example implementation is illustrated in FIG. 2A, which shows how the invention could be configured with external circuitry to switch a pair of AC motor coils represented by L1 and L3. The motor could either use both coils LI and L3, in which case they are configured to run opposite polarity, or it could use only one coil. If only one coil L1 is needed, then AC2 is shorted to V2 and the circuit operates with LI as the only load. FIG. 2B displays voltage waveforms for the circuit of FIG. 2A. In this example, the AC input is 120Vrms (169Vpeak) 60 Hz. Coils L1 and L3 are identical in value so their waveforms are the same (Coil≈AC Input/2). The logic input is 5V dc pulsed at 15 Hz. When the logic input is HIGH, Q1 is ON, "closing" the switch and allowing current to pass through the load. When the logic input is LOW, Q1 shuts OFF, "opening" the switch. The control transistor Q2 ensures a "normally open" state when there is no logic input, or In_A is held LOW with reference to In_K.

Example 2

Figure 3A:
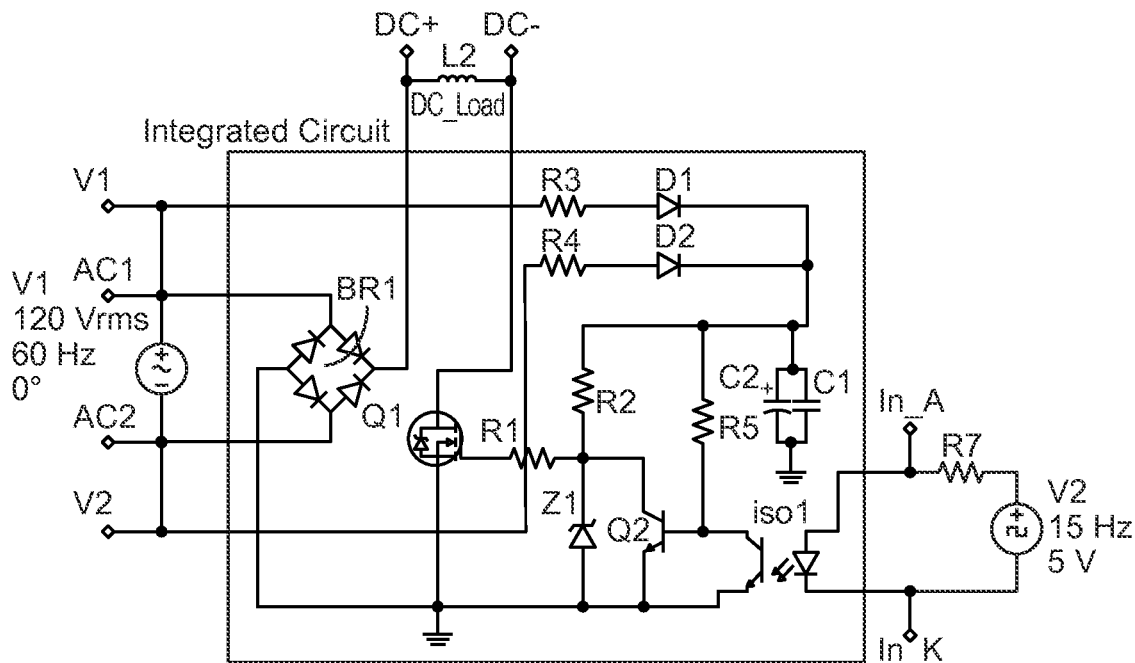
FIG. 3A shows an example configured to run a DC load with various AC or DC input voltages.
Figure 3B:
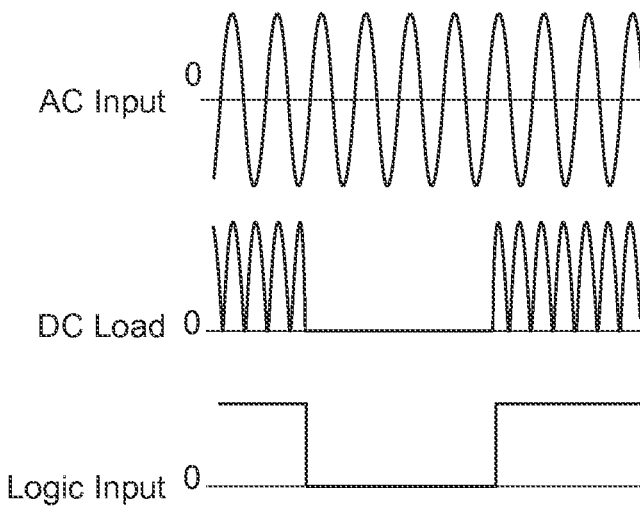
FIG. 3B shows schematic waveforms for the circuit of FIG. 3A.

A second implementation of the embodiments of the invention is shown in FIG. 3A, where the figure displays how the circuit could be configured to run a DC load with various input voltages. V1 is connected to AC1 and V2 is connected to AC2. In this configuration, input power can be AC or DC and reversing polarity will have no effect on the operation of the circuit. The positive side of the load is connected to the positive output of BR1 and the negative side of the load is switched through MOSFET Q1. When Q1 is ON, current will flow from the positive output of BR1, through the DC load, through Q1 from drain to source, then back to the negative output of BR1. An advantage of this embodiment is that the circuit operates without damage to the equipment irrespective of whether the input supply is AC or DC. This example simply shows how this invention differs from previous solutions in this one method of using it. FIG. 3B displays voltage waveforms for the circuit of FIG. 3A. As illustrated in Example 1, the logic input is 5Vdc pulsed at 15 Hz. When the logic input is high, Q1 is ON, "closing" the switch and allowing current to pass through the load. When the logic input is low, Q1 shuts OFF, "opening" the switch. Control transistor Q2 ensures a "normally open" state when there is no logic input, or In_A is held LOW with reference to In_K.

What is claimed is:
1. A method for controlling a switching circuit, comprising:

providing a bridge rectifier comprising a positive output and a negative output;

controlling a gate of a field effect transistor (FET) using a control signal, wherein a source of the FET is connected to the negative output of the bridge rectifier and a drain of the FET is connected to the positive output of the bridge rectifier through a load;

electrically combining a first circuit input and a second circuit input through a first resistor-diode pair and a second resistor-diode pair to limit current flowing to the gate of the FET; and electrically connecting a diode between the negative output of the bridge rectifier and the gate of the FET.

2. The method of claim 1 wherein the diode is a Zener diode to limit a voltage to the gate of the FET below a maximum voltage rating of the FET.

3. The method of claim 1 wherein the control signal is provided, based on a logic input signal, by a transistor electrically connected to the gate of the FET across the diode.

4. The method of claim 3 further comprising:
providing a pull-up resistor between the combined inputs and a gate of the transistor to further limit the current flowing to the gate of the FET.

5. The method of claim 1 wherein the control signal is provided, based on a logic input signal, by an isolator electrically connected to the gate of the FET.

6. The method of claim 1 wherein the control signal is provided by a transistor electrically connected between the gate of the FET and an isolator, the isolator controlling the transistor to provide the control signal based on a received logic input signal.

7. The method of claim 6 wherein the isolator controls the transistor to electrically connect the gate of the FET to the source of the FET to open the FET and electrically connect the drain of the FET to the source of the FET to close the FET.

8. The method of claim 1 further comprising:
filtering noise from the combined inputs through a first capacitive circuit.

9. The method of claim 1 further comprising:
maintaining a positive voltage at the gate of the FET through a second capacitive circuit.

10. The method of claim 1 wherein the bridge rectifier maintains the source of the FET at a negative voltage value and the drain of the FET at a positive voltage value.

11. A switching circuit, comprising:
a bridge rectifier comprising a positive output and a negative output;

a field effect transistor (FET) comprising a source, a gate, and a drain, using a control signal, the source of the FET electrically connected to the negative output of the bridge rectifier and the drain of the FET electrically connected to the positive output of the bridge rectifier;

an electrically combined node comprising a first circuit input through a first resistor-diode pair and a second circuit input through a second resistor-diode pair to limit current flowing to the gate of the FET; and a diode electrically connecting between the negative output of the bridge rectifier and the gate of the FET.

12. The switching circuit of claim 11 wherein the diode is a Zener diode to limit a voltage to the gate of the FET below a maximum voltage rating of the FET.

13. The switching circuit of claim 11 further comprising:
a transistor electrically connected to the gate of the FET across the diode, the transistor providing a control signal, based on a logic input signal, to the gate of the FET.

14. The switching circuit of claim 13 further comprising:
a pull-up resistor between the combined node and a gate of the transistor to further limit the current flowing to the gate of the FET.

15. The switching circuit of claim 11 further comprising:
an isolator electrically connected to the gate of the FET providing a control signal, based on a logic input signal, to the gate of the FET.

16. The switching circuit of claim 11 further comprising:
a transistor electrically connected between the gate of the FET; and
an isolator, the isolator controlling the transistor to provide a control signal to the gate of the FET based on a received logic input signal.

17. The switching circuit of claim 16 wherein the isolator controls the transistor to electrically connect the gate of the FET to the source of the FET to open the FET and electrically connect the drain of the FET to the source of the FET to close the FET.

18. The switching circuit of claim 11 further comprising:
a first capacitive circuit filtering noise from the combined node.

19. The switching circuit of claim 11 further comprising:
a second capacitive circuit maintaining a positive voltage at the gate of the FET.

20. The switching circuit of claim 11 wherein the bridge rectifier maintains the source of the FET at a negative voltage value and the drain of the FET at a positive voltage value.

* * * * *